United States Patent
Prisbrey

(10) Patent No.: US 6,759,141 B2
(45) Date of Patent: Jul. 6, 2004

(54) OXIDATION PREVENTATIVE CAPPING LAYER FOR DEEP-ULTRA-VIOLET AND SOFT X-RAY MULTILAYERS

(75) Inventor: Shon T. Prisbrey, Livermore, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/137,065

(22) Filed: Apr. 30, 2002

(65) Prior Publication Data

US 2004/0101710 A1 May 27, 2004

(51) Int. Cl.⁷ ............................................. B32B 15/00
(52) U.S. Cl. ..................... 428/635; 428/641; 428/670; 428/663
(58) Field of Search .................. 428/635, 670, 428/641, 663, 687

(56) References Cited

U.S. PATENT DOCUMENTS

| | | | |
|---|---|---|---|
| 4,915,463 A | * 4/1990 | Barbee, Jr. ................. 359/360 |
| 5,080,862 A | 1/1992 | Luthra | |
| 5,149,596 A | * 9/1992 | Smith et al. ................ 428/656 |
| 5,265,143 A | * 11/1993 | Early et al. ................. 378/84 |
| 5,356,662 A | 10/1994 | Early et al. | |
| 5,576,579 A | 11/1996 | Agnello et al. | |
| 5,893,549 A | * 4/1999 | Pina et al. ................ 359/846 |
| 5,958,605 A | * 9/1999 | Montcalm et al. .......... 428/627 |
| 6,048,652 A | * 4/2000 | Nguyen et al. ................ 430/5 |
| 2002/0084425 A1 | * 7/2002 | Klebanoff et al. ....... 250/492.1 |
| 2002/0196896 A1 | * 12/2002 | Kitayama et al. ............ 378/34 |

FOREIGN PATENT DOCUMENTS

JP          11-287900      * 10/1999

* cited by examiner

Primary Examiner—John J. Zimmerman
(74) Attorney, Agent, or Firm—John P. Wooldridge; Alan H. Thompson

(57) ABSTRACT

The invention uses iridium and iridium compounds as a protective capping layer on multilayers having reflectivity in the deep ultra-violet to soft x-ray regime. The iridium compounds can be formed in one of two ways: by direct deposition of the iridium compound from a prepared target or by depositing a thin layer (e.g., 5–50 angstroms) of iridium directly onto an element. The deposition energy of the incoming iridium is sufficient to activate the formation of the desired iridium compound. The compounds of most interest are iridium silicide ($IrSi_x$) and iridium molybdenide ($IrMo_x$).

25 Claims, 2 Drawing Sheets

OXIDATION PREVENTATIVE CAPPING LAYER FOR DEEP-ULTRA-VIOLET AND SOFT X-RAY MULTILAYERS

The United States Government has rights in this invention pursuant to Contract No. W-7405-ENG48 between the United Stabes Department of Energy and the University of California for the operation of Lawrence Livermore National Laboratory.

BACKGROUND OF THE INVENTION

1. Field of the Invention

The present invention relates to capping layers for multilayer reflective coatings used in extreme ultraviolet or soft x-ray lithography applications.

2. Description of Related Art

Extreme ultraviolet (EUV) and soft x-ray projection lithography make use of optical elements with highly reflective multilayer coatings. These multilayer coatings typically consist of alternating layers of molybdenum (Mo) and silicon (Si) or molybdenum and beryllium (Be). High EUV reflectivity is essential for lithography applications. A critical limitation to achieving the maximum theoretical peak reflectivity is the oxidation and corrosion of the top layers, which both increases the absorption and degrades the phase coherence of the reflection from these layers.

Multilayers built to reflect photons in the soft x-ray to ultraviolet regime decrease in reflectance upon exposure to oxygen due to an oxidation of the multilayer surface and/or an oxidation of the bulk of the multilayer caused by diffusion and bonding of oxygen. The presence of the oxygen decreases reflectance since it is heavily absorbing in this energy regime. The problem to be solved is stopping the oxidation of the multilayer surface and bulk.

Although there have been numerous investigations of carbon-based, boron carbide-based, and silicon-based multilayer coatings for EUV mirrors, there has been little work on environmental effects (e.g., oxidation and corrosion) of these structures. Underwood et al. (Applied Optics 32:6985 (1993)) investigated the aging effects of Mo—Si multilayers by monitoring the decrease in reflectivity with time. Their experimental results showed a degradation of the Mo—Si multilayer reflectance caused by the oxidation of the topmost layer of molybdenum. Underwood et al. identified the oxidation of the molybdenum layer as a potential problem in soft x-ray projection lithography. The proposed solutions were to make silicon the topmost layer, to store the optical elements in an inert atmosphere or vacuum, or to remove the oxidized surface by sputtering or chemical etching. Underwood et al. did not investigate the use of passivating layers.

Mo/Si multilayers with Mo as the top layer have the highest theoretically possible reflectivity; however, Mo is not stable in air and therefore Mo/Si multilayers for EUV optics are usually capped with a Si top layer with a loss in reflectivity of 1.3%. After exposure to air, this layer partly oxidizes and forms $SiO_2$ that absorbs EUV light and reduces the reflectance of the multilayer by about another 1–2%. This reflectance of Si capped multilayers will remain unchanged for years if the multilayers are kept at room temperatures. See C. Montcalm, S. Bajt, P. B. Mirkarimi, E. Spiller, F. J. Weber, and J. A. Folta, in "Emerging Lithographic Technologies II", ed. Y. Vladimnirsky, SPIE Vol 3331,42–51 (1998). However, in a working EUV lithography tool the coatings are exposed to EUV illumination in the presence of low pressure background gases including water, oxygen, and hydrocarbons. L. Klebanoff et al., M. Wedowski et al. references have shown that the reflectance of Si capped Mo/Si multilayers decreased as a function of EUV illumination dose and the amount of water vapor and other background gases in the system.

In the soft x-ray and extreme ultraviolet regime of the spectrum, all materials adsorb. In order to reflect any appreciable amount of light at these wavelengths, multilayer structures must be used and matched to the desired reflected wavelength The physical principles that makes the multilayer structures reflect are the use of low index to high index interfaces and the spacing of the interfaces such that the small amount reflected from an individual interface constructively adds with the reflections from the other interfaces. This constructive interference allows for theoretical reflections higher than 10% from a 40 bilayer structure (13.4 nm desired reflected wavelength). The key to such high reflectivities is two fold: the physical structure of the multilayer stack and the materials used in its construction.

Ideally, the materials used would be non-adsorbing and environmentally stable when exposed to other elements in a variety of conditions. Unfortunately, all materials adsorb to varying degrees at these wavelengths. The key is building a multilayer structure that has large index of refraction differences between layers and has the interfaces between those layers to be very abrupt In order to preserve the high reflectivity achieved by such structures, the multilayer stack must be environmentally stable when subjected to a high flux of radiation in a hostile environment Traditionally silicon or a similar material has been used as the top most layer (or capping layer) of multilayer structures due to the formation of a passivating oxide when it is exposed to atmosphere at room temperature.

Silicon and other similar materials may provide sufficient protection for the multilayer structure at high fluxes of radiation in a hostile environment due to the formation of secondary electrons created by the incoming radiation. These secondary electrons effectively mimic a high temperature environment and can cause water on the surface to split into oxygen and hydrogen. The oxygen can then penetrate through the original passivating layer and cause the multilayer stack to oxidize. The oxidation of the multilayer stack destroys its high reflectivity by changing the indexes of refraction of the layers and by causing greater adsorption of the incoming radiation. Thus, a high reflectance multilayer structure in the soft x-ray/extreme ultraviolet regime can only be used in the absence of water, oxygen, and other hostile compounds or the multilayer structure must be protected from exposure to the hostile compounds by the use of an effective capping layer.

U.S. Pat. No. 5,958,605, titled "Passivating Overcoat Bilayer For Multilayer Reflective Coatings For Extreme Ultraviolet Lithography", discloses a passivating overcoat bilayer that is used for multilayer reflective coatings for extreme ultraviolet (EUV) or soft x-ray applications to prevent oxidation and corrosion of the multilayer coating thereby improving the EUV optical performance.

U.S. Pat. No. 5,080,862, titled "Iridium Silicon Alloy" teaches an alloy having a very high resistance to oxidation. The alloy contains between 30 and 75 atom percent of silicon in an iridium base. The alloy may be used in the form of a surface coating to protect structural elements of other materials from oxidation. The alloy may also be used as an ingredient of a composite.

SUMMARY OF THE INVENTION

It is an object of the present invention to provide capping layer designs that use iridium and iridium compounds for the prevention of bulk oxidation and/or surface oxidation of multilayer coatings.

It is another object of the invention to provide control over the oxidation thickness of the capping layer of molybdenum/silicon thin films by replacing the top of the silicon capping layer with iridium silicide.

Another object of the invention is to provide control over the oxidation thickness of the capping layer of molybdenum/silicon thin films by terminating the thin film with molybdenum and then depositing or forming iridium molybdenide ($IrMo_x$) as a capping layer.

Still another object of the invention is to prevent oxygen diffusion into the thin film structure by use of iridium compound(s) as a capping layer.

These and other objects will be apparent to those skilled in the art based on the disclosure herein.

Iridium and/or iridium compounds are used as the capping layer on multilayer structures designed for use in the soft x-ray to extreme ultraviolet regime of the spectrum The use of iridium as part of the capping layer allows for greater versatility in the processes used to dean or pattern the surface of the capping layer. The use of an indium compound as a capping layer could stop the iridium from oxidizing and provide a non-permeable, passive barrier assuming the lattice spacing is small enough.

An optimized capping layer is formed of indium or iridium compound used with an optically less absorbing material (in the deep ultra-violet/soft x-ray regime). This optimization counters the absorption of the iridium and allows for the use of indium or iridium compounds as a capping layer without decasing the reflectivity by more than a few percent This application teaches solutions to problems that might arise with the use of iridium and/or iridium compounds as a capping layer. Some of the problems solved are: (i) the diffusion of the iridium into the multilayer stack, (ii) long term oxidation of the iridium that would allow water to permeate the capping layer and begin oxidizing the multilayer stack, and (iii) a large decrease in reflectivity of the multilayer stack caused by radiation being adsorbed by the capping layer.

DETAILED DESCRIPTION OF THE INVENTION

Figure 1:
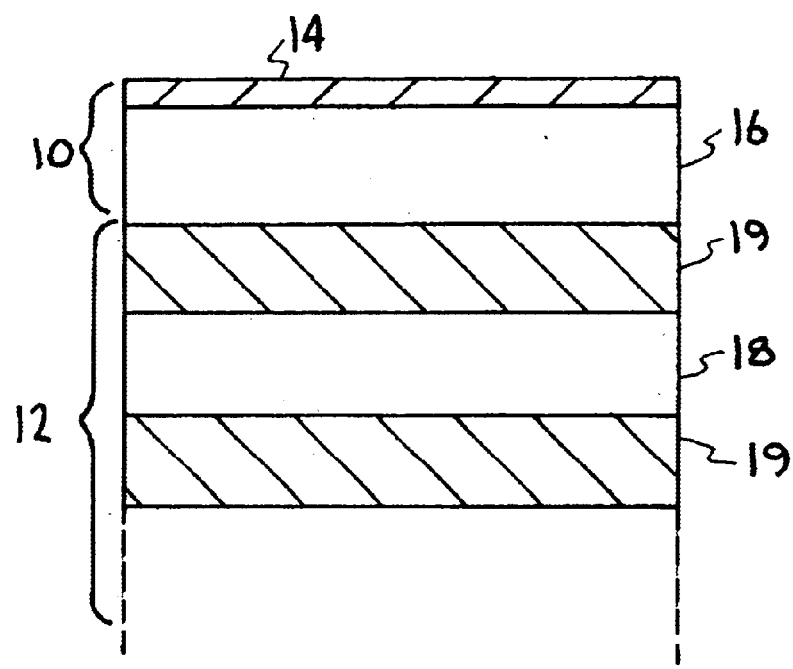
FIG. 1 shows an embodiment of an optimized capping layer on a multilayer thin film.

The present invention uses indium and/or iridium compounds as the capping layer on multilayer structures designed for use in the soft x-ray to extreme ultraviolet regime of the spectrum. Iridium oxidizes at about 600 degrees Celsius but the reverse reaction occurs at 1100 Celsius leaving behind a pure iridium metal well below its boiling point (~4130° C.). Iridium is the most corrosive resistant metal known (CRC 71$^{st}$ edition page 4–17) and is not attacked by acids or by aqua regia. The use of iridium as part of the capping layer allows for greater versatility in the processes used to clean or pattern the surface of the capping layer. Iridium compounds may also be used as a capping layer. Iridium oxide is somewhat porous to water and could allow water to react with the multilayer structure. The use of an iridium compound as a capping layer could stop the iridium from oxidizing and provide a non-permeable, passive barrier assuming the lattice spacing is small enough.

The iridium or iridium compound can be used with an optically less absorbing material (in the deep ultraviolet/soft x-ray regime) to form an optimized capping layer. This optimization counters the absorption of the iridium and allows for the use of iridium or iridium compounds ($Ir\beta_x$) as a capping layer without decreasing the reflectivity by more than a few percent.

Problems that might arise with the use of iridium and/or iridium compounds as a capping layer are: (i) the diffusion of the iridium into the multilayer stack, (ii) long term oxidation of the iridium that would allow water to permeate the capping layer and begin oxidizing the multilayer stack, and (iii) a large decrease in reflectivity of the multilayer stack caused by radiation being adsorbed by the capping layer.

Solving the Problems

Diffusion of the Iridium into the Multilayer Stack

During the growth of the capping layer the iridium/iridium compound atoms are deposited on top of the multilayer structure. Two factors that might cause the iridium to diffuse into the multilayer stack are: (i) the momentum and energy of the incoming iridium atom would cause the iridium atom to implant to some depth into the multilayer structure, or (ii) the surface energy would be higher having an iridium atom on the surface compared with the energy of the original terminating multilayer structure surface. If the problem is the former, the deposition conditions can be modified within a certain range to give the incoming iridium atom less energy and thereby stop or limit the implanting of the iridium into the multilayer structure. If the reason is that of increased surface energy when single atoms of iridium are placed on top of the multilayer structure, then a diffusion barrier becomes necessary when the diffusion of the iridium into the multilayer stack is not self passivating or does not have an acceptable self passivating diffusion length. The diffusion problem can be overcome by placing a layer of material between the iridium/iridium compound layer and the multilayer structure that does have an acceptable self passivating diffusion length with the top of the multilayer structure and the iridium to act as a diffusion barrier.

Long Term Oxidation of the Iridium that Would Allow for Water/Oxygen to Permeate the Capping Layer Pure iridium oxidizes to form $IrO_2$, which is rutile in structure. This changes the lattice spacing between the iridium atoms in the layer and makes the layer permeable to oxygen and water. In this case another passivating layer would need to be placed between the pure iridium and the multilayer structure to stop the contamination of the multilayer structure with oxygen. An iridium compound that does not oxidize would be ideal for this purpose in that it protects the multilayer from oxidation but still allows for a pure iridium surface to be exposed to the environment.

Large Decrease in Reflectivity of the Multilayer Stack Caused by Radiation Being Absorbed by the Capping Layer Iridium has a high index of refraction in the soft x-ray/extreme ultraviolet regime of the speck The adsorption of iridium in this regime is also large meaning that too much iridium would cause a large decrease in reflectivity due to adsorption of the incoming radiation by the capping layer. The adsorption effect restricts the thickness of the capping layer and depends explicitly on the materials used in the capping layer.

A solution is the use of a thin layer of iridium/iridium compound (0.5 nm to 6.5 nm). The multilayer structure sets up a reflected standing wave that has nodes and antinodes. A lightly adsorbing spacer layer could be used to position the thin layer of iridium/iridium compound such that the node of the reflected standing wave would be in the middle of the iridium/iridium compound layer. Example materials usable as the lightly adsorbing spacer layer include silicon, boron carbide ($B_4C$), carbon, and berylium (depending on the wavelength of the multilayer stack). Since the adsorption of the radiation is directly related to the strength of its electric field and the iridium/iridium compound would be positioned to interact with the radiation when the electric field is at its weakest, thus causing the adsorption of radiation and correspondingly the decrease in reflectivity to be smaller.

FIG. 1 shows an embodiment of an optimized capping layer 10 on a multilayer thin film EZ The capping layer 10 includes an iridium compound layer 14 and a layer 16, e.g., of either molybdenum or silicon. Multilayer thin film 12 comprises alternating layers of high and low index material e.g., of molybdenum or silicon respectively. If layer 16 comprises a low index material, then layer 19 will comprise a high index material The thickness of the optimized capping layer 10 should be about the same thickness as layer 18.

Figure 2:
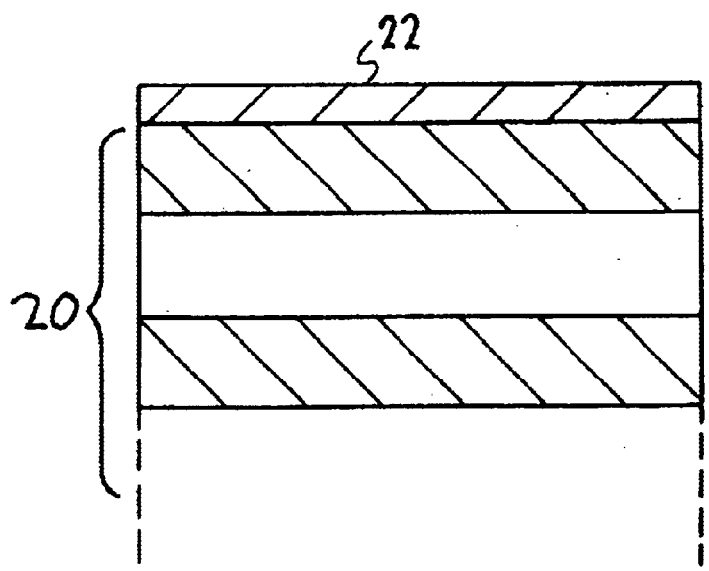
FIG. 2 shows another embodiment of a multilayer thin film with an iridium compound layer deposited directly onto the top of the multilayer.
Figure 3:
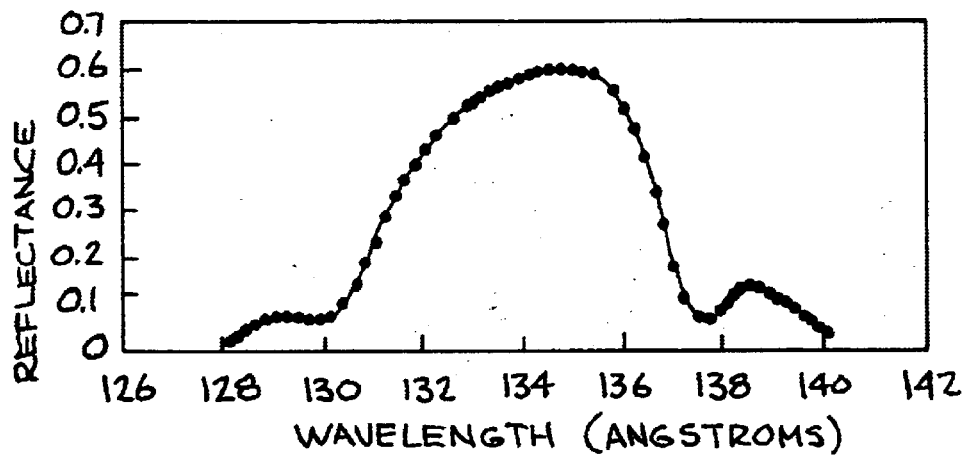
FIG. 3 shows a reflectance curve for an IrSi capped multilayer.
Figure 4:
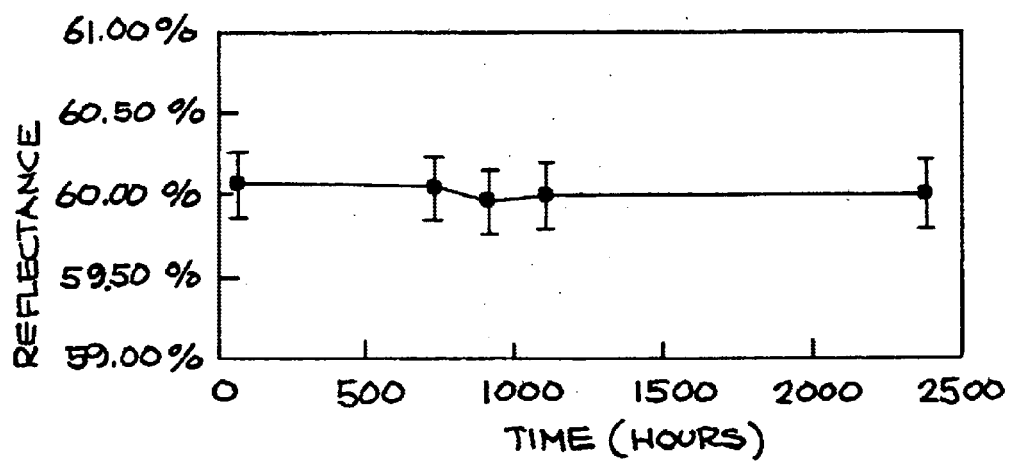
FIG. 4 shows the reflectance vs. time for an iridium silicide cap.

FIG. 2 shows an embodiment comprising a multilayer thin film 20 with an iridium compound layer 22 deposited directly onto the top of the multilayer 20. FIG. 3 shows a reflectance curve for an IrSi capped multilayer. FIG. 4 shows the reflectance vs. time for an iridium silicide cap.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

I claim:

1. A passivating overcoat layer for a multilayer reflective coating designed for use in extreme ultraviolet or soft x-ray applications, comprising a top overcoat layer deposited on said multilayer reflective coating, wherein said top overcoat layer comprises a top overcoat layer material that resists oxidation and corrosion and protects said multilayer reflective coating from oxidation, wherein said top overcoat layer material is selected from the group consisting of iridium molybdenide ($IrMo_x$) and iridium silcide ($IrSi_x$).

2. The overcoat layer of claim 1, wherein said multilayer reflective coating comprises a top layer, wherein said overcoat layer further comprises a bottom overcoat layer affixed to said top layer of said multilayer reflective coating, wherein said top overcoat layer is deposited on said bottom overcoat layer.

3. The overcoat layer of claim 2, wherein said bottom overcoat layer comprises a bottom overcoat layer material that prevents diffusion of said top overcoat layer into said top layer of said multilayer reflective coating, wherein said bottom overcoat layer material material is selected from the group consisting of molybdenum and silicon.

4. The overcoat layer of claim 2, wherein said bottom overcoat layer comprises a plurality of components.

5. The overcoat layer of claim 2, wherein said bottom overcoat layer comprises a plurality of layers.

6. The overcoat layer of claim 1, wherein said top overcoat layer comprises a plurality of components.

7. The overcoat layer of claim 1, wherein said top overcoat layer comprises a plurality of layers.

8. The overcoat layer of 2, wherein the thickness of said bottom layer is combined with the thickness of said top layer of said multilayer coating.

9. The overcoat layer of claim 2, wherein said top overcoat layer and said bottom overcoat layer have optimum thicknesses selected such that their combined thickness is phase-matched with the underlying multilayer coating.

10. The overcoat layer of claim 2, wherein said top overcoat layer and said bottom overcoat layer have thicknesses, wherein the thickness of said top overcoat layer is selected to protect the underlying layers from oxidation, and wherein the thickness of said bottom overcoat layer is selected such that their combined thickness is phase-matched with the underlying multilayer coating.

11. The overcoat layer of claim 2, wherein said top overcoat layer and said bottom overcoat layer have thicknesses that are optimized to maximize the normal incidence reflectance at an operating wavelength in the deep ultraviolet to soft x-ray regimes.

12. The overcoat layer of claim 1, wherein said top overcoat layer has a thickness ranging from about 0.5 nm to about 7 nm.

13. The overcoat layer of claim 2, wherein said bottom overcoat layer has a thickness ranging from about 0.5 nm to about 7 nm.

14. The overcoat layer of claim 1, wherein said multilayer coating comprises a layer comprising silicon and a layer comprising molybdenum.

15. The overcoat layer of claim 1, wherein said multilayer coating comprises a layer comprising beryllium and a layer comprising molybdenum.

16. A method for forming a passivating overcoat layer for a multilayer reflective coating designed for use in extreme ultraviolet or soft x-ray applications, comprising:

providing a multilayer reflective coating; and depositing on said multilayer reflective coating a top overcoat layer comprising a top overcoat layer material that resists oxidation and corrosion and protects said multilayer reflective coating from oxidation, wherein said top overcoat layer material is selected from the group consisting of iridium molybdenide ($IrMo_x$) and iridium silcide ($IrSi_x$).

17. The method of claim 16, further comprising depositing on said multilayer coating a bottom overcoat layer comprising a bottom overcoat layer material that will reduce or prevent interdiffusion, wherein said top overcoat layer is deposited onto said bottom overcoat layer, wherein said bottom overcoat layer comprises a bottom overcoat layer material selected from the group consisting of silicon and molybdenum.

18. The method of claim 17, wherein the deposition of said bottom overcoat layer or said top overcoat layer is carried out by vapor phase deposition.

19. The method of claim 17, wherein said bottom overcoat layer comprises a plurality of components.

20. The method of claim 17, wherein said bottom overcoat layer comprises a plurality of layers.

21. The method of claim 16, wherein said top overcoat layer comprises a plurality of components.

22. The method of claim 16, wherein said top overcoat layer comprises a plurality of layers.

23. The overcoat layer of claim 2, wherein when said top overcoat layer material comprises iridium silicide ($IrSi_x$) said bottom overcoat layer material comprises silicon.

24. The overcoat layer of claim 1, wherein when said top overcoat layer material comprises iridium silicide (IrSi$_x$), said overcoat layer further comprises a middle overcoat layer of silicon affixed to the bottom of said top overcoat layer, further comprising a bottom overcoat layer material that prevents diffusion of said middle overcoat layer into said top layer of said multilayer reflective coating, wherein said bottom overcoat layer material is selected from the group consisting of molybdenum and silicon.

25. The overcoat layer of claim 2, wherein when said top overcoat layer material comprises iridium silicide (IrSi$_x$), said bottom overcoat layer comprises a bottom overcoat layer material that prevents diffusion of said top overcoat layer into said multilayer reflective coating, wherein said bottom overcoat layer material is selected from the group consisting of molybdenum and silicon.

* * * * *